(12) United States Patent
Iida et al.

(10) Patent No.: US 10,042,356 B2
(45) Date of Patent: Aug. 7, 2018

(54) SUBSTRATE PROCESSING APPARATUS, METHOD FOR CORRECTING POSITIONAL DISPLACEMENT, AND STORAGE MEDIUM

(71) Applicant: TOKYO ELECTRON LIMITED, Tokyo (JP)

(72) Inventors: Naruaki Iida, Koshi (JP); Katsuhiro Morikawa, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 0 days.

(21) Appl. No.: 14/625,201

(22) Filed: Feb. 18, 2015

(65) Prior Publication Data

US 2015/0235888 A1    Aug. 20, 2015

(30) Foreign Application Priority Data

Feb. 20, 2014  (JP) ................................. 2014-030783

(51) Int. Cl.
| H01L 21/677 | (2006.01) |
| G05B 19/418 | (2006.01) |
| H01L 21/687 | (2006.01) |
| H01L 21/68 | (2006.01) |

(52) U.S. Cl.
CPC .... *G05B 19/4189* (2013.01); *H01L 21/67766* (2013.01); *H01L 21/681* (2013.01); *H01L 21/68707* (2013.01); *G05B 2219/45031* (2013.01); *Y02P 90/28* (2015.11)

(58) Field of Classification Search
CPC ...... G05B 19/4189; G05B 2219/45031; H01L 21/681; H01L 21/67766; H01L 21/68707
See application file for complete search history.

(56) References Cited

U.S. PATENT DOCUMENTS

| 4,819,167 A | 4/1989 | Cheng et al. |
| 6,339,730 B1 | 1/2002 | Matsushima |
| 2004/0067127 A1* | 4/2004 | Hofmeister ............... B25J 19/02 414/744.5 |
| 2007/0273892 A1* | 11/2007 | Asari ....................... B25J 9/163 356/614 |
| 2011/0160900 A1 | 6/2011 | Morita |

(Continued)

FOREIGN PATENT DOCUMENTS

| JP | S64-48443 A | 2/1989 |
| JP | 2001-110873 A | 4/2001 |

(Continued)

OTHER PUBLICATIONS

Taiwanese Office Action (Application No. 104105460) dated Oct. 25, 2016.

*Primary Examiner* — Patrick J Maestri
(74) *Attorney, Agent, or Firm* — Burr & Brown, PLLC

(57) ABSTRACT

A substrate processing apparatus includes: first and second places in which a substrate can be placed; a substrate transfer device having a substrate holder that holds the substrate to transfer the substrate between the first and second places; and a substrate position measuring unit that detects a position of the substrate held by the substrate holder. The substrate position measuring unit, disposed independently of the substrate transfer device, is arranged at a position where the substrate held by the substrate holder of the substrate transfer device can be placed.

13 Claims, 11 Drawing Sheets

(56) References Cited

U.S. PATENT DOCUMENTS

2012/0327428 A1* 12/2012 Hellwig ................ H01L 21/681
                                                      356/614
2013/0211571 A1   8/2013 Teramoto et al.
2013/0218337 A1* 8/2013 Minami ................ B25J 9/1682
                                                      700/248

FOREIGN PATENT DOCUMENTS

| JP | 2009-218622 A | 9/2009 |
| JP | 2013-165119 A1 | 8/2013 |
| TW | 201142554 A1 | 12/2011 |

* cited by examiner

SUBSTRATE PROCESSING APPARATUS, METHOD FOR CORRECTING POSITIONAL DISPLACEMENT, AND STORAGE MEDIUM

CROSS REFERENCE TO RELATED APPLICATION

This application is based upon and claims the benefit of priority from Japanese patent application No. 2014-030783 filed on Feb. 20, 2014, the entire contents of which are incorporated herein by reference.

FIELD OF THE INVENTION

The present invention relates to a technique for positioning a substrate transferred by a substrate transfer device provided for a substrate processing apparatus.

BACKGROUND ART

A substrate processing system has a substrate carrying-in/out unit that is referred to as a load port or the like. A front opening unified pod (FOUP) configured to contain multiple substrates such as semiconductor wafers, or a substrate transfer container called carrier is carried into the substrate carrying-in/out unit. The substrates in the substrate transfer container are extracted by a first substrate transfer device provided for the substrate processing system and are then moved to an intermediate place for placing the substrate thereon that is referred to as a buffer or the like. After that, the substrates are extracted from the intermediate place by a second substrate transfer device installed in a region where a large number of processing units are arranged. The substrates are subsequently transferred into the processing units. The processing units each execute a predetermined process on the substrates.

As described in JP-2013-165119-A, the substrate transfer devices or substrate transfer robots each have a frame capable of moving in a horizontal direction (Y axis), an ascending and descending body capable of moving in a vertical direction (Z axis) along the frame, a base capable of rotating around a vertically directional axis line (θ axis) with respect to the ascending and descending body, and a plurality of substrate holders (referred to as picks, forks, or the like) capable of being advanced to and retracted from the base in the horizontal direction (X axis). Since orthogonal coordinate system robots of the aforementioned type can detect relative positions between the substrate holders and the substrates with the use of a sensor installed in the base, the robots are further capable of correcting detected positional displacement and placing the substrates on target transfer destinations. These operations improve the reliability of the transfer of the substrates by the substrate transfer devices.

However, in a horizontal articulated robot, if sensors for achieving the aforementioned function are attached to the horizontal articulated robot itself, the movement of an arm might be limited in order to avoid collision of arm with members holding the sensors.

SUMMARY OF THE INVENTION

An object of the invention is to provide a technique for improving the reliability of substrate transfer by a substrate transfer device, without the movement of the substrate transfer device being limited by a member for detecting relative positions between substrate holders and the substrates.

In one embodiment of the present invention, there is provided a substrate processing apparatus including: first and second places in which a substrate can be placed; a substrate transfer device having a substrate holder that holds the substrate to transfer the substrate between the first and second places; and a substrate position measuring unit that detects a position of the substrate held by the substrate holder, wherein the substrate position measuring unit, disposed independently of the substrate transfer device, is arranged at a position where the substrate held by the substrate holder of the substrate transfer device can be placed.

In another embodiment of the present invention, there is provided a method for correcting positional displacement of a substrate in a substrate processing apparatus, the apparatus including first and second places in which a substrate can be placed, a substrate transfer device having a substrate holder that holds the substrate to transfer the substrate between the first and second places, and a substrate position measuring unit that detects a position of the substrate held by the substrate holder and is arranged at a position that is independent of the substrate transfer device and at which the substrate held by the substrate holder of the substrate transfer device can be placed. The method includes: causing the substrate transfer device to transfer the substrate to the substrate position measuring unit, causing the substrate position measuring unit to detect the position of the substrate held by the substrate holder, calculating, based on the detected position of the substrate, positional displacement of an actual position of the substrate held by the substrate holder with respect to the substrate holder from a target position of the substrate holder to be held by the substrate holder with respect to the substrate holder, and causing the substrate transfer device to place, based on the calculated positional displacement, the substrate in the second place so as to cancel out the positional displacement. In addition, yet another embodiment of the present invention provides a non-transitory storage medium storing a program for position displacement correction method.

In the foregoing embodiments, since the substrate position measuring unit is independently disposed from the substrate transfer device, the movement of the substrate transfer device is not limited by the substrate position measuring unit. Thus, the reliability of the transfer of substrates by the substrate transfer device can be improved while the substrates are smoothly transferred.

DESCRIPTION OF EMBODIMENTS

Figure 1:
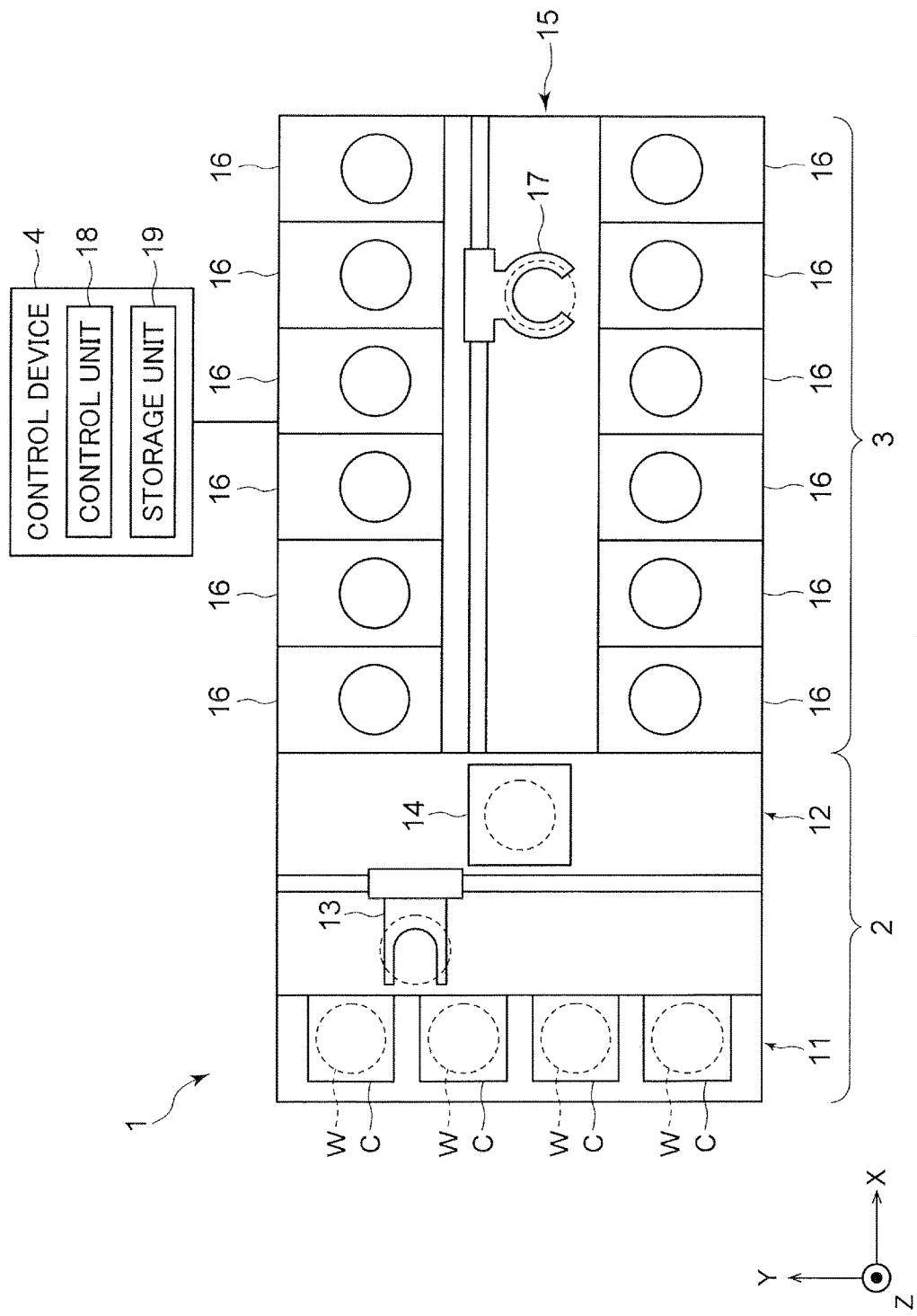
FIG. 1 is a plan view illustrating an outline configuration of a substrate processing system (substrate processing apparatus) according to an embodiment of the invention.

FIG. 1 is a plan view illustrating an outline of a substrate processing system provided with a processing unit according to an exemplary embodiment of the present disclosure. In the following, in order to clarify positional relationships, the X-axis, Y-axis and Z-axis which are orthogonal to each other will be defined. The positive Z-axis direction will be regarded as a vertically upward direction.

As illustrated in FIG. 1, a substrate processing system 1 includes a carry-in/out station 2 and a processing station 3. The carry-in/out station 2 and a processing station 3 are provided adjacent to each other.

The carry-in/out station 2 is provided with a carrier placing section 11 and a transfer section 12. In the carrier placing section 11, a plurality of carriers C is placed to accommodate a plurality of substrates (semiconductor wafers in the present exemplary embodiment) (hereinafter, referred to as "wafers W") horizontally.

The transfer section 12 is provided adjacent to the carrier placing section 11, and provided with a substrate transfer device 13 and a delivery unit 14. The substrate transfer device 13 is provided with a wafer holding mechanism configured to hold the wafer W. Further, the substrate transfer device 13 is movable horizontally and vertically and pivotable around a vertical axis, and transfers the wafers W between the carriers C and the delivery unit 14 by using the wafer holding mechanism.

The processing station 3 is provided adjacent to the transfer section 12. The processing station 3 is provided with a transfer section 15 and a plurality of processing units 16. The plurality of processing units 16 is arranged at both sides of the transfer section 15.

The transfer section 15 is provided with a substrate transfer device 17 therein. The substrate transfer device 17 is provided with a wafer holding mechanism configured to hold the wafer W. Further, the substrate transfer device 17 is movable horizontally and vertically and pivotable around a vertical axis. The substrate transfer device 17 transfers the wafers W between the delivery unit 14 and the processing units 16 by using the wafer holding mechanism.

The processing units 16 perform a predetermined substrate processing on the wafers W transferred by the substrate transfer device 17.

Further, the liquid processing system 1 is provided with a control device 4. The control device 4 is, for example, a computer, and includes a control unit 18 and a storage unit 19. The storage unit 19 stores a program that controls various processings performed in the liquid processing system 1. The control unit 18 controls the operations of the liquid processing system 1 by reading and executing the program stored in the storage unit 19.

Further, the program may be recorded in a computer-readable recording medium, and installed from the recording medium to the storage unit 19 of the control device 4. The computer-readable recording medium may be, for example, a hard disc (HD), a flexible disc (FD), a compact disc (CD), a magnet optical disc (MO), or a memory card.

In the substrate processing system 1 configured as described above, the substrate transfer device 13 of the carry-in/out station 2 first takes out a wafer W from a carrier C placed in the carrier placing section 11, and then places the taken wafer W on the transfer unit 14. The wafer W placed on the transfer unit 14 is taken out from the transfer unit 14 by the substrate transfer device 17 of the processing station 3 and carried into a processing unit 16.

The wafer W carried into the processing unit 16 is processed by the processing unit 16, and then, carried out from the processing unit 16 and placed on the delivery unit 14 by the substrate transfer device 17. After the processing of placing the wafer W on the delivery unit 14, the wafer W returns to the carrier C of the carrier placing section 11 by the substrate transfer device 13.

The configuration of a carrying-in/out station will now be described in detail. A substrate transfer device 13 schematically illustrated in FIG. 1 is actually formed as a horizontal articulated robot 130 as illustrated in FIG. 2.

Figure 2:
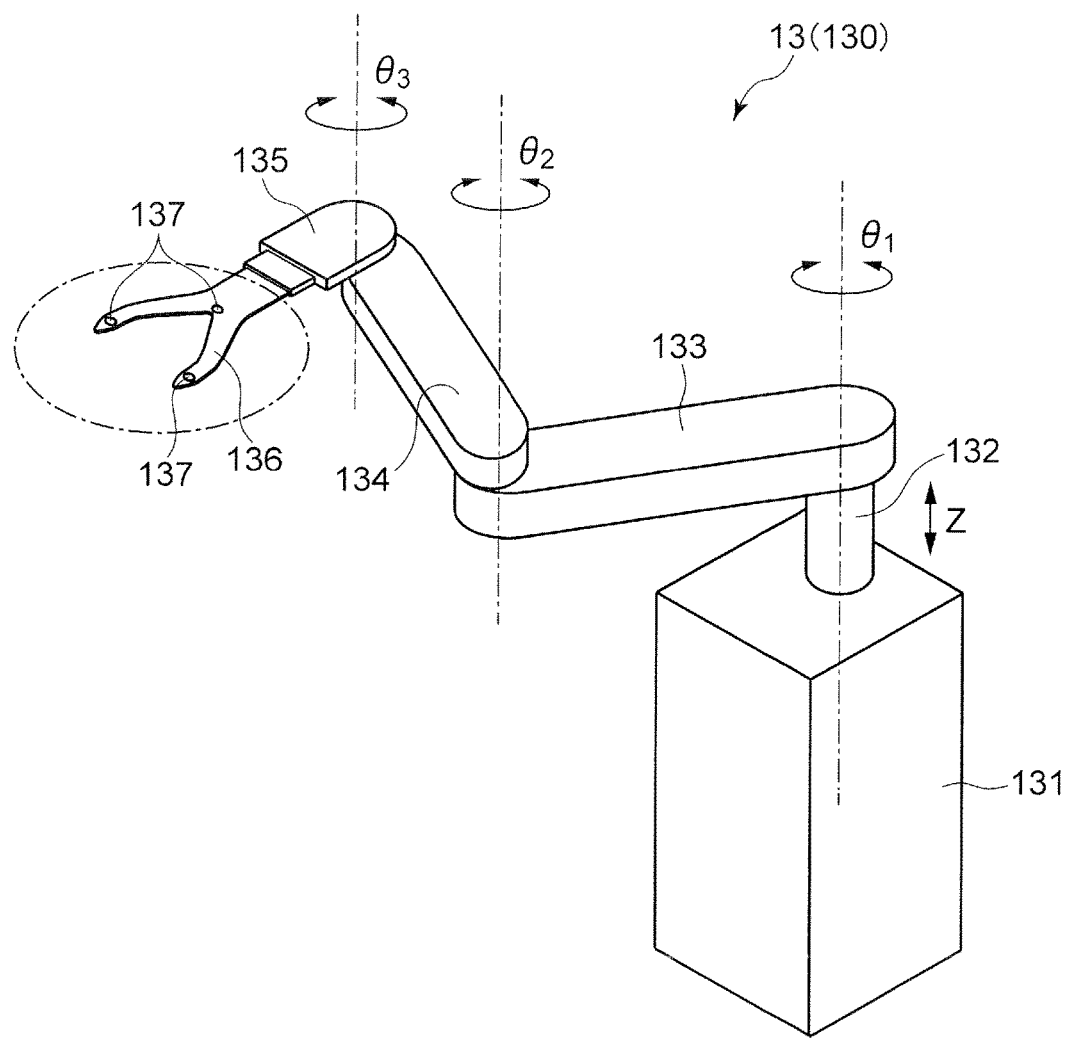
FIG. 2 is a perspective view illustrating a configuration of a first substrate transfer device formed as an articulated robot.
Figure 3:
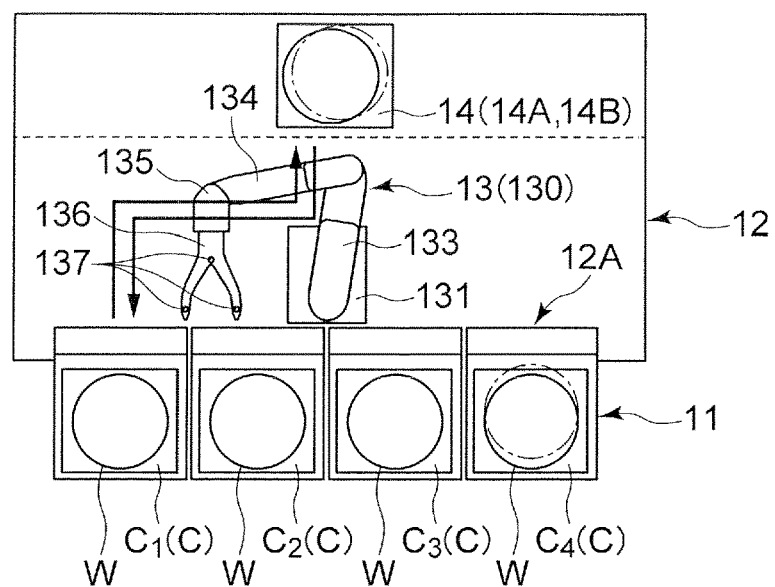
FIG. 3 is a plan view illustrating a configuration of a carrying-in/out station in which the first substrate transfer device is arranged.
Figure 4:
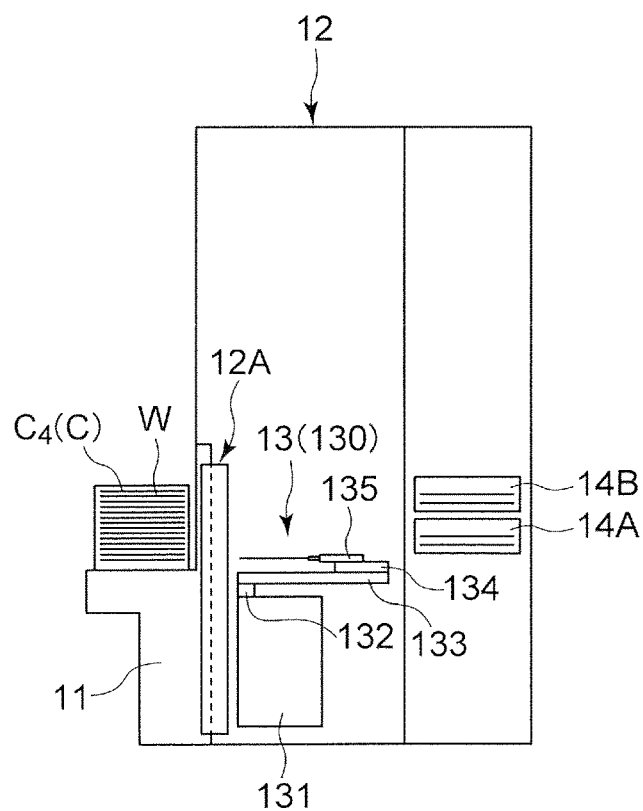
FIG. 4 is a side view illustrating the configuration of the carrying-in/out station in which the first substrate transfer device is arranged.

As illustrated in FIGS. 2 to 4, the horizontal articulated robot 130 includes a base 131 fixed to a floor surface of the carry-in/out station 2, a first arm 133 capable of rotating around a vertically directional axis line ($\theta 1$) and attached to the base 131 through a shaft 132 capable of moving (ascending and descending) in a vertical direction (Z), a second arm 134 capable of rotating around a vertically directional axis line ($\theta 2$) and attached to the first arm 133 through a shaft (not illustrated in FIG. 2), and a third arm 135 capable of rotating around a vertically directional axis line ($\theta 3$) and mounted to the second arm 134 through a shaft (not illustrated in FIG. 2) and a wafer pick (substrate holder) 136 attached to the third arm 135. The wafer pick 136 has a plurality of vacuum chucks 137 and is capable of holding a wafer W by vacuum suctioning.

The horizontal articulated robot 130 combines operations related to the aforementioned axes ($\theta 1$, $\theta 2$, $\theta 3$, and Z) and thereby accesses any slot of any carrier C placed on a carrier placing station 11 and any wafer stage (delivery stage 1410 or 1420 described later) installed in a delivery unit 14.

In FIGS. 3 and 4, a reference symbol 12A schematically indicates members such as a wall arranged between the carrier placing station 11 and a transfer section 12, openings provided for and corresponding to positions at which the carriers C are placed, shutters for closing the openings, and a device configured to attach and detach lids of the carriers C. The members are known in the concerned technical field and a description thereof is hence omitted.

The configuration of the delivery unit 14 will now be described with reference to FIGS. 4 to 10.

As schematically illustrated in FIG. 4, the delivery unit 14 includes a lower delivery unit 14A and an upper delivery unit 14B. The lower delivery unit 14A relays an unprocessed wafer W extracted from a carrier C during a process (forward path) of transferring the wafer W to a processing unit 16. The upper delivery unit 14B relays the wafer W processed by the processing unit 16 during a process (backward path) of transferring the wafer W to the carrier C. Hereinafter, a configuration of the lower delivery unit 14A will be described as a representative example.

The lower delivery unit 14A has a delivery stage 1410 and normal delivery stages 1420. The delivery stage 1410 is the lowest stage and has a measurement function (that is, the delivery stage 1410 is also configured as a measuring unit), while the delivery stages 1420 are the second lowest and higher stages.

Figure 5:
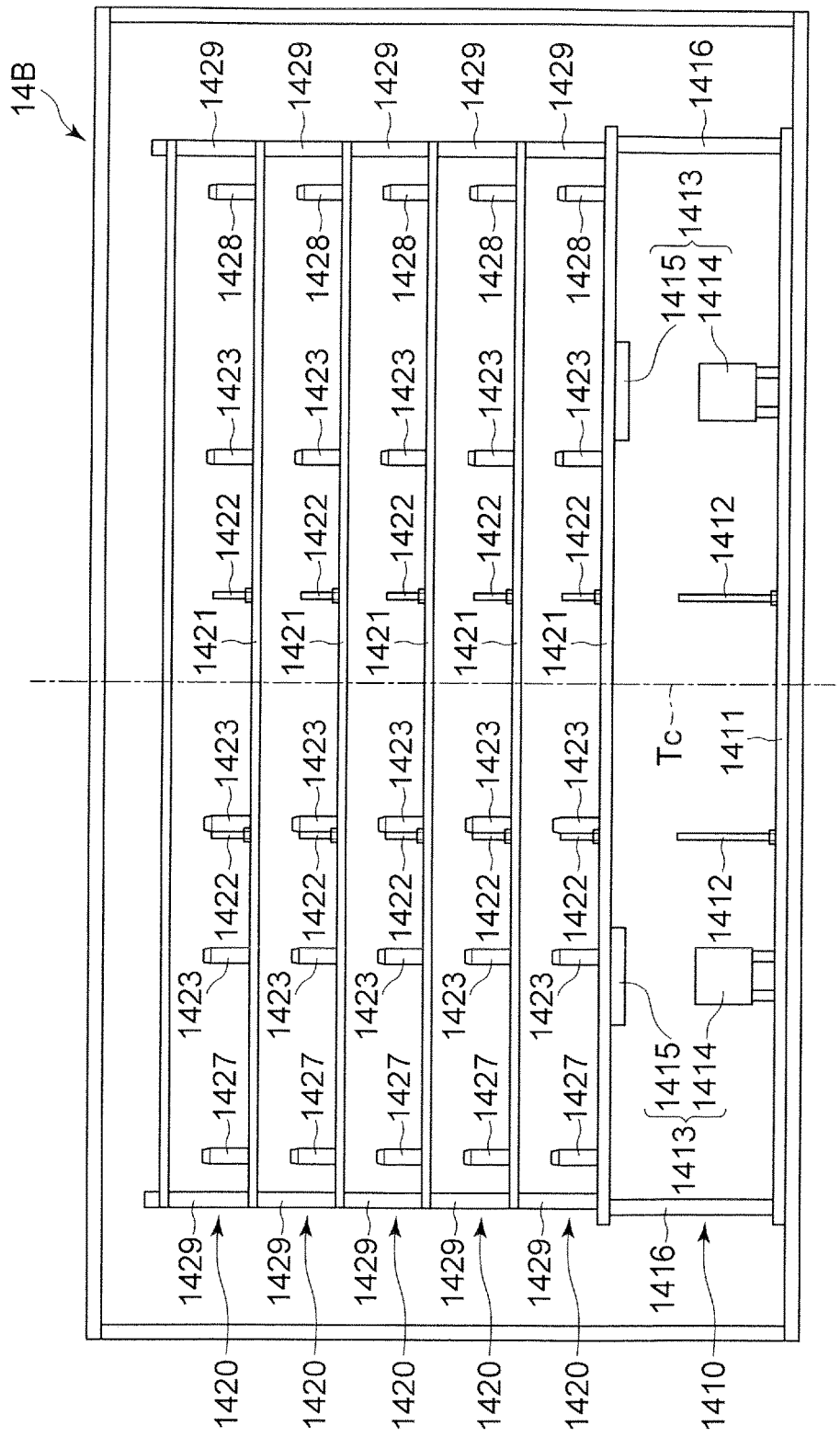
FIG. 5 is a vertically cross-sectional view illustrating a configuration of a delivery unit.
Figure 6:
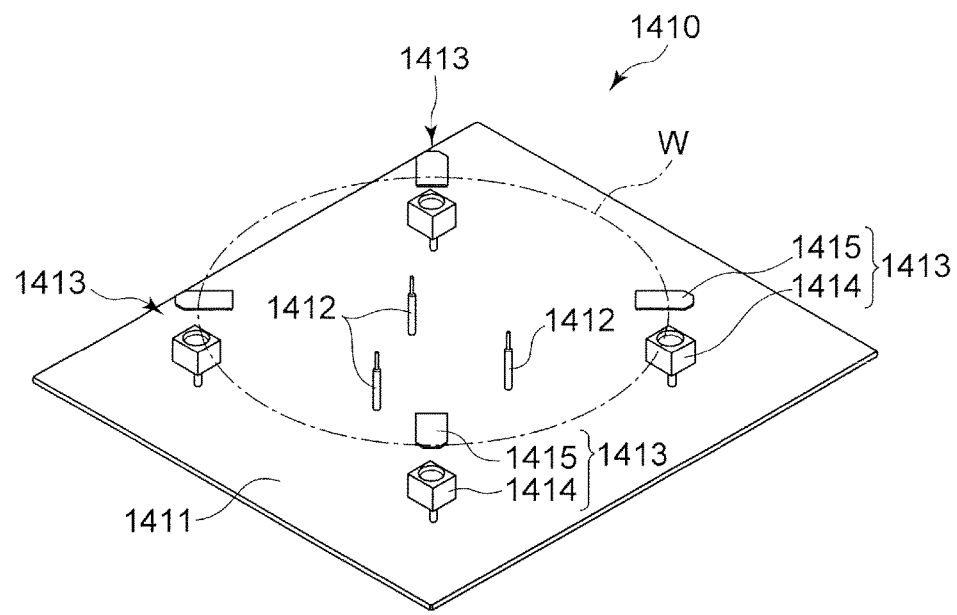
FIG. 6 is a perspective view describing a configuration of a delivery stage provided with a measurement function in a state in which a ceiling portion has been removed.

As illustrated in FIGS. 5 and 6, the lowest delivery stage 1410 provided with the measurement function has a bottom plate 1411 and multiple (three in this example) wafer holding pins 1412 attached to the bottom plate 1411. A lower surface of the wafer W is held by edges of the wafer holding pins 1412. The wafer holding pins 1412 are arranged in such a place where the wafer pick 137 does not collide with the wafer holding pins 1412 when the substrate transfer device 13 of the carrying-in/out station 2 and a substrate transfer device 17 of a processing station 3 enter a space located above the bottom plate 1411 before positional displacement (described later) of the wafer W is detected and corrected. Alternatively, the wafer holding pins 1412 are also arranged when the wafer W tries to be placed on or extracted from the wafer holding pins 1412.

Although the wafer W is not placed on the wafer holding pins 1412 of the delivery stage 1410 provided with the measurement function in a normal transfer routine, the substrate transfer devices 13 and 17 can place and extract the wafer W on and from the wafer holding pins 1412.

In particular, as clearly illustrated in FIG. 6, four edge position detecting devices 1413 are arranged in the delivery stage 1410 provided with the measurement function. The respective edge position detecting devices 1413 have light irradiators 1414 for emitting parallel light upward and line sensors 1415 for receiving the light emitted by the light irradiators 1414. The light irradiators 1414 are attached to the bottom plate 1411, while the line sensors 1415 are attached to a bottom plate 1421 (or a ceiling plate of the delivery stage 1410 provided with the measurement function) of the second lowest normal delivery stage 1420 located immediately above the delivery stage 1410.

Although edge position detecting devices 1413 only need to be arranged at three positions at least, the four edge position detecting devices 1413 are arranged at positions determined by dividing a circle by four or are arranged at angular intervals of 90 degrees. The line sensors 1415 each have a light receiving element array (not illustrated) composed of a plurality of light receiving elements arranged along a straight line. A direction in which the light receiving element arrays of the line sensors 1415 are arranged matches a radial direction of a virtual wafer W (refer to the wafer W indicated by an alternate long and short dash line illustrated in FIG. 6) that is not displaced at all. When the wafer W enters the delivery stage 1410 provided with the measurement function, the wafer W blocks a part of light emitted by the light irradiators 1414 and the other part of the light reaches the line sensors 1415. Boundaries between light receiving elements on which the light is not incident and light receiving element on which the light is incident correspond to the position of a circumferential edge Wc (refer to FIGS. 8 and 10) of the wafer W. The edge position detecting devices 1413 can identify coordinates of the circumferential edge of the wafer W or coordinates (r, 0) in an r-θ polar coordinate system whose origin is the center Tc (refer to FIGS. 5 and 10) of the delivery stage 1410. In the r-θ polar coordinate system, "r" is a variable that varies based on positional displacement of the wafer W, and "θ" is a constant that can be represented by 90n (deg) (n=0, 1, 2, or 3) based on the positions of the edge position detecting devices 1413. It is easy to transform the polar coordinates (r, θ) to coordinates in an X-Y coordinate system whose origin is the center Tc of the delivery stage 1410.

It is apparent that coordinates of the center of the wafer W formed in a circular plate shape can be calculated through geometrical calculation using a known method (for example, a method using an equation of a circle that passes through three points) based on coordinates of three points on the circumference edge of the wafer W. In the present embodiment, since four edge position sensors 145 are provided which can identify coordinates of four points on the circumferential edge of the wafer W, they can naturally calculate the center Wc of the wafer. In addition, the coordinates of the center Wc of the wafer can be calculated with a smaller error by installing a single additional edge position sensor 145.

Figure 7:
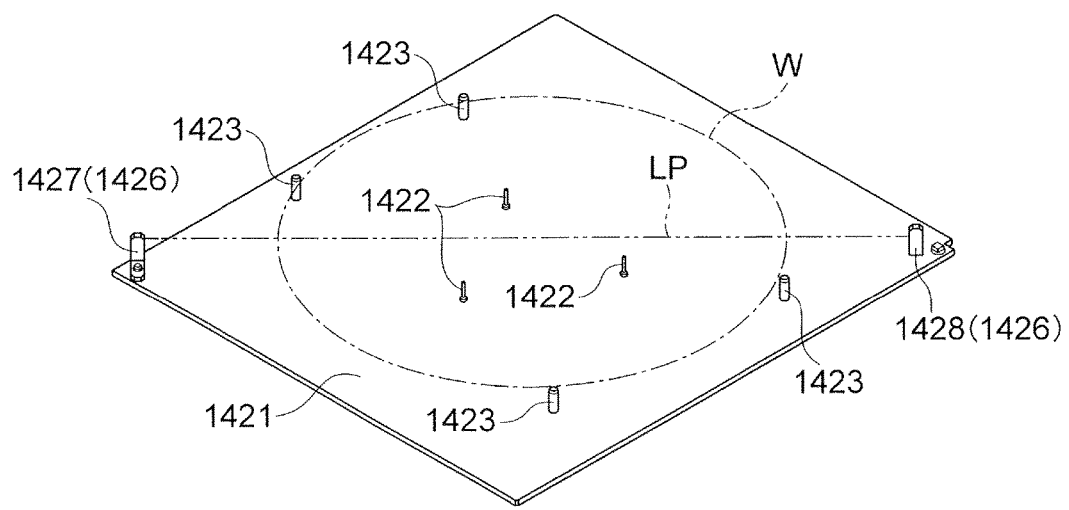
FIG. 7 is a perspective view describing a configuration of a normal delivery unit in a state in which a ceiling portion has been removed.
Figure 8:
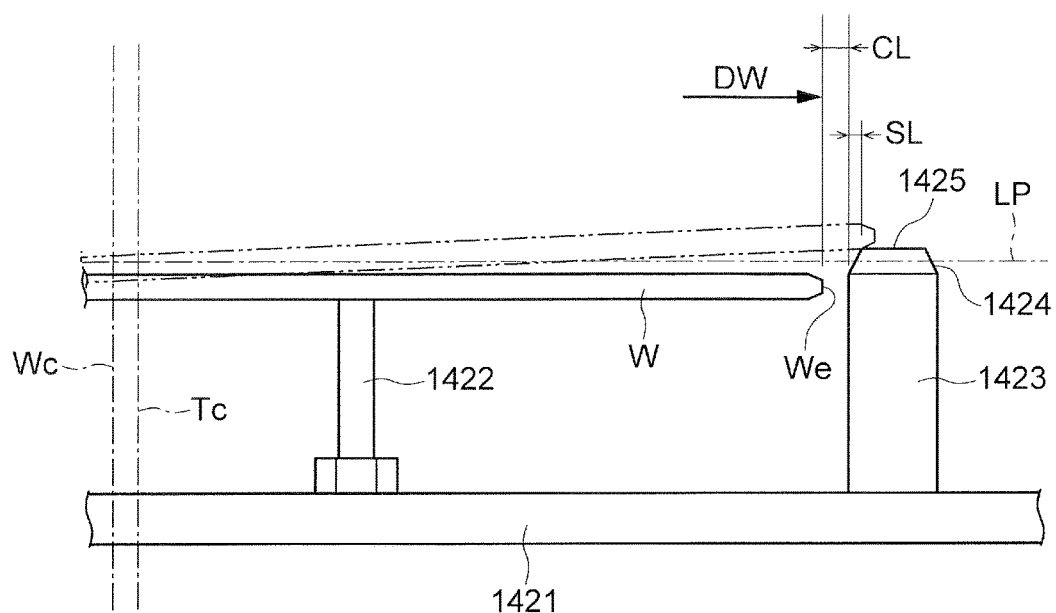
FIG. 8 is a side view describing the action of the normal delivery stage.

Moreover, as illustrated in FIGS. 7 and 8, the normal delivery stages 1420 have bottom plates 1421 to which multiple (three in this example) wafer holding pins 1422 are attached. The normal delivery stages 1420 each have multiple (four in this example) guide pins (wafer guide members) 1423 attached to the bottom plate 1421.

The guide pins 1423 are arranged such that there are predetermined gaps CL between the circumferential edge of the wafer W and the guide pins 1423 when the wafer W is placed on the wafer holding pins 1422 without being displaced at all. Specifically, the guide pins 1423 are arranged so that if the diameter of the wafer W is referred to as DW, a circle with a diameter of (DW+CL) is an inscribed circle of the four guide pins 1423.

Guide surfaces 1424 (conical surfaces of circular truncated cones in the example illustrated in FIG. 8), inclined so that the surfaces become closer to the circumferential edge of the wafer W toward the lower side, are arranged on upper edge portions of the guide pins 1423. If the wafer W tries to be placed on the wafer holding pins 1422 and the circumferential edge of the wafer W becomes in contact with any of the guide surfaces 1424, the wafer W will downwardly slide on the guide surface 1424 so as to be appropriately placed on the three wafer holding pins 1422. Meanwhile, if the wafer W tries to be placed on the wafer holding pins 1422 and consequently rides onto any of upper end surfaces 1425 of the guide pins 1423, the wafer W will not be appropriately placed on the three wafer holding pins 1422 (refer to the wafer W indicated by a broken line in FIG. 8).

The guide surfaces 1424 each have a width SL measured in a diametrical direction of the wafer W passing through a central axis line of the guide pin 1423. Thus, as long as the amount of positional displacement of the wafer W that is measured in a direction from the center of the wafer W to any of the guide pins 1423 is smaller than a value of "the gap CL+the width SL," the wafer W will be appropriately placed on the three wafer holding pins 1422 and the maximum amount of the final displacement of the wafer W that is measured in the aforementioned direction will be equal to or smaller than CL.

The gap CL is set to a value that enables the wafer holders of the substrate transfer device 17 of a transfer unit 15 to receive the wafer from any of the normal delivery stages 1420 without affecting the reception. As an example, in a case where the wafer W is a next-generation 18-inch wafer, the gap CL would be, for example, in a range of 2 to 3 mm. The shapes and widths SL of the guide surfaces 1424 are set so that problematic damage does not occur to an edge portion (bevel portion) of the wafer W when the wafer W downwardly slides on any of the guide surfaces 1424.

Ride sensors 1426 are arranged on the bottom plates 1421 of the normal delivery stages 1420 and configured to detect that the wafer W has ridden onto any of the upper end surfaces 1425 of the guide pins 1423. The ride sensors 1426 are each composed of a light emitter 1427 and a light receiver 1428. The light emitter 1427 emits parallel light toward the light receiver 1428. A light path LP of the parallel light extends in a diametrical direction of the wafer W when viewed in a plan view. The light path LP of the parallel light extends so as to be parallel to and very close to the upper surface of the wafer W appropriately placed on the wafer holding pins 1422 when viewed in a side view (refer to, for example, FIG. 8) (for example, a gap between the upper surface of the wafer W and the light path LP is approximately 1 mm). The light path LP is set to have such positional relationships. Thus, even in a case where the wafer W rides onto any of the guide pins 1423, the ride would be detected by the single light path LP.

The bottom plates 1411 and 1421 of the delivery stages 1410 and 1420 that are adjacent each other are coupled to each other respectively through columns 1416 and 1429 arranged between the bottom plates. A gap between the bottom plate 1411 of the delivery stage 1410 provided with the measurement function and the bottom plate 1421 of the normal delivery stage 1420 located immediately above the delivery stage 1410 is set to be larger than gaps between the bottom plates 1422 adjacent to each other and corresponding to the other normal delivery stages 1420 so as to secure a space in which the edge position detecting devices 1413 detect the position of the edge of the wafer.

The upper delivery unit 14B may have the same configuration as the aforementioned lower delivery unit 14A. However, the upper delivery unit 14B may not have the delivery stage 1410 provided with the measurement function since positional displacement of the wafer extracted by the substrate transfer device 17 from any of the processing units 16 on a wafer pick 170 normally does not cause a problem in later processes.

Figure 9:
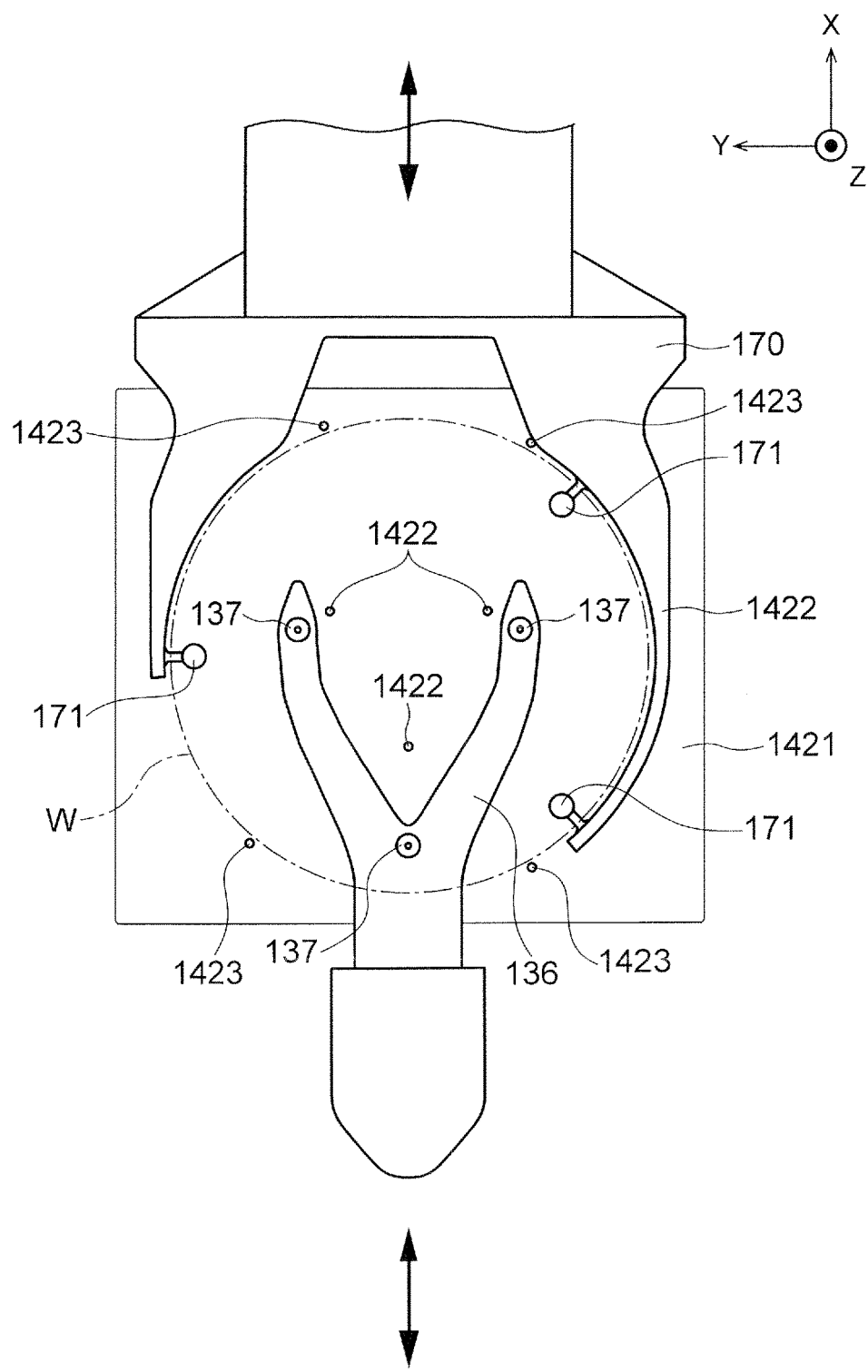
FIG. 9 is a plan view describing a state in which wafer picks of first and second substrate transfer devices access the normal delivery stage.

FIG. 9 illustrates a state in which the substrate transfer device 13 (or the wafer pick 136 of the horizontal articulated robot 130) and the wafer pick (also referred to as fork) 170 of the substrate transfer device 17 access any of the normal delivery stages 1420.

In a plan view illustrated in FIG. 9, the wafer pick 170, formed in a substantially U shape, has an arc contour portion. The wafer pick 170 has holding nails 171 extending from the arc contour portion toward the wafer W. Upper surfaces of the three holding nails 171 hold the lower surface of the wafer W so that the wafer W is held by the wafer pick 170. In this manner, in a case where the wafer W is significantly displaced from a specified position, the wafer W would not be placed on the holding nails 171 of the wafer pick 170 for holding a narrow region of a circumferential edge portion of the wafer W from the lower side, and thus the wafer pick 170 would not be able to appropriately hold the wafer W. Allowable positional displacement of the wafer W is, for example, in a range of 2 mm to 3 mm in a radial direction of the wafer W in order to appropriately hold the wafer W.

Meanwhile, the wafer pick 136 suctions the lower surface of the wafer W by vacuum chucks (for example, three vacuum chucks) (also referred to as "vacuum pads" or the like) 137 and holds the wafer W. The wafer pick 136 can hold the wafer W even if the position of the wafer W is significantly displaced as long as all the vacuum chucks 137 are in contact with the lower surface of the wafer W.

The wafer W may not be positioned with high accuracy in a substrate transfer container (corresponding to the carriers C illustrated in FIG. 1) such as a FOUP. However, the substrate transfer device 13 (or the wafer pick 136 of the horizontal articulated robot 130) extracts the wafer while assuming that the wafer W exists at a standard position (for example, a central position of a movement range of the wafer W in a carrier C) within the carrier C. Then, the wafer pick 136 of the horizontal articulated robot 130 places the wafer W in any of the normal delivery stages 1420 on the premise that the wafer W is held at the standard position. Thus, if the position of the wafer W is displaced within the carrier C, the position of the wafer W will be displaced for the positional displacement in the normal delivery stage 1420. It should be noted that the position of the wafer W may be displaced at a time the wafer pick 136 holds the wafer W.

If the position of the wafer W is displaced in the normal delivery stage 1420 such that the displacement is not in the allowable range, the wafer pick 170 for which an allowable range of positional displacement is small may not extract the wafer W from the normal delivery stage 1420 and not hold the wafer W in an appropriate state. In addition, in cases where the wafer pick 170 of the substrate transfer device 17 is configured to hold the wafer W by suctioning the wafer W with vacuum in the same manner as the wafer pick 136 of the substrate transfer device 13, the wafer pick 170 might be able to extract the wafer W from the normal delivery stage 1420. However, positional displacement of the wafer W when the substrate transfer device 13 extracts the wafer W from a carrier C is taken over when the wafer W is held by the wafer pick 170 of the substrate transfer device 17. Thus, if the positional displacement is beyond the self-alignment (self-centering) capability of the substrate holders of the processing unit 16 at a time of the transfer of the wafer from the substrate transfer device 17 to the processing unit 16, the wafer W cannot be transferred to the processing unit 16.

A procedure of transferring a substrate in order to solve the aforementioned problem will be described below.

<First Procedure>

A first procedure will be described with reference to FIGS. 10 and 11.

Figure 11:
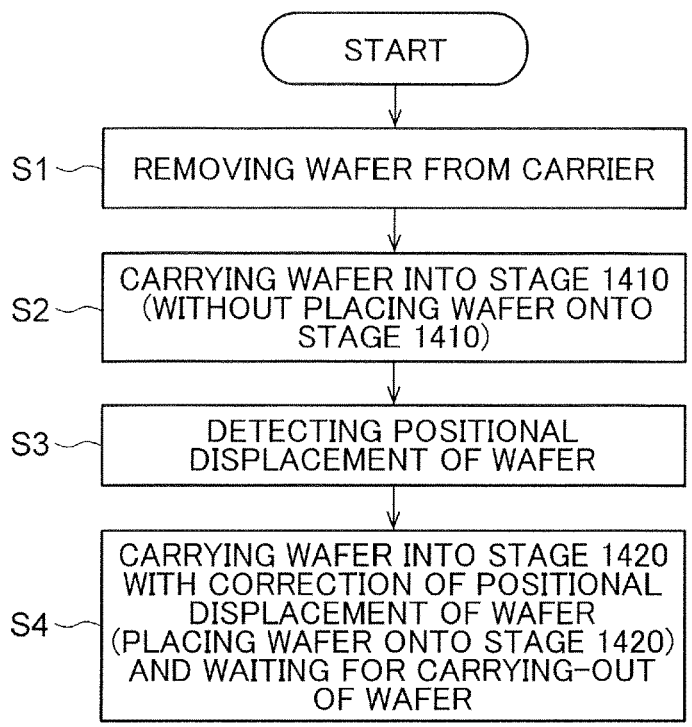
FIG. 11 is a flowchart of a first procedure of correcting positional displacement of a wafer.

First, the wafer pick 136 of the horizontal articulated robot 130 extracts the wafer W from any of the carriers C (in step S1 illustrated in FIG. 11).

The wafer pick 136 enters the delivery stage 1410 provided with the measurement function while holding the wafer W. In FIG. 10, positional relationships between constituent members of the delivery stage 1410 provided with the measurement function are slightly different from the actual positional relationships in order to emphasize the visibility of FIG. 10. The actual positional relationships between the constituent members are illustrated in FIG. 6. In a case where the wafer W is placed at the standard position in the carrier C without being displaced, the wafer pick 136 would stop at a position where the center Wc of the wafer W matches the center Tc of the delivery stage 1410 provided with the measurement function. In this case, the wafer pick 136 would not place the wafer W on the wafer holding pins 1412 (this paragraph describes step S2 illustrated in FIG. 2).

The light irradiators 1414 emit parallel light in the above state. In FIG. 10, a reference symbol 1413A indicates light paths of the parallel light emitted by the light irradiators 1414. The alternate long and short dash lines indicate positions at which the circumferential edge Wc of the wafer is located when the center Wc of the wafer W matches the center Tc of the delivery stage 1410 provided with the measurement function.

Figure 10:
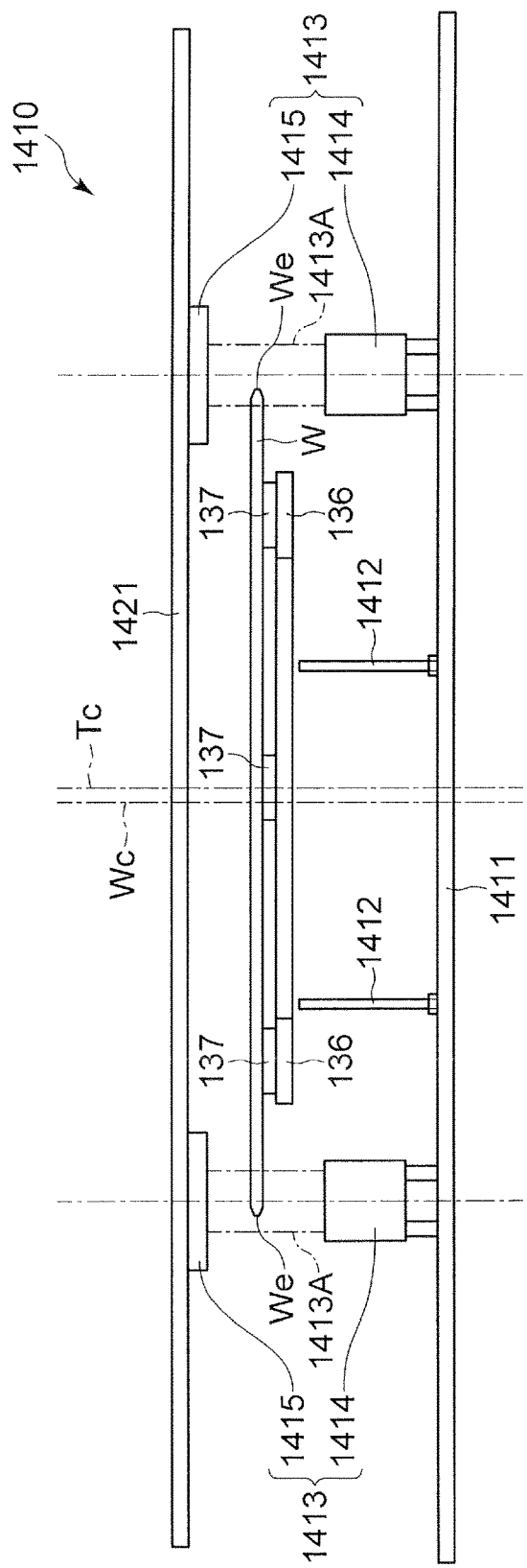
FIG. 10 is a side view describing the action of the delivery stage provided with the measurement function.

FIG. 10 illustrates a state in which the center Wc of the wafer W is displaced from the center Tc of the delivery stage 1410 provided with the measurement function as a result of the fact that the actual position of the wafer W is displaced from a target position of the wafer W held by the wafer pick 136 with respect to the wafer pick 136 due to positional displacement of the wafer W within a carrier C. In this case, the position of the circumferential edge Wc of the wafer W is also displaced. Coordinates of four points on the circumferential edge Wc of the wafer W are detected by the four wafer edge position detecting devices 1413 whereas coordinates of the center Wc of the wafer W held by the wafer pick 136 are calculated on the basis of values of the detected coordinates of the four points described above. Thus, a direction in which the center Wc of the wafer W is displaced from the center Tc of the delivery stage 1410 provided with the measurement function and the amount of the displacement can be determined.

The direction and amount of the displacement can be expressed by the coordinates (for example, a, b) of the center Wc of the wafer W while the center Tc of the delivery stage 1410 is treated as the origin (0, 0) of an X-Y orthogonal coordinate system. Although an r-θ orthogonal coordinate system can be used, the X-Y orthogonal coordinate system will be described below (the above describes step S3 illustrated in FIG. 11).

After that, the wafer pick 136 is retracted from the delivery stage 1410 without letting the water W touch any object located in the space of the delivery stage 1410 provided with the measurement function and without placing the wafer W on the wafer holding pins 1412. Since the wafer W is not placed on the wafer holding pins 1412 in the delivery stage 1410 provided with the measurement function in the aforementioned procedure, a required time of the procedure can be reduced and the throughput can be thereby improved compared to a case where the wafer W is placed on the wafer holding pins 1412.

After that, the wafer pick 136 enters any of the normal delivery stages 1420 and places the wafer W on the wafer holding pins 1422. In this case, the wafer pick 136 shifts a target position of the wafer W on the wafer holding pins 1422 by "−a" in X direction and by "−b" in Y direction so as to cancel out the calculated positional displacement of the center Wc of the wafer W from the center Tc of the delivery stage 1410 provided with the measurement function and places the wafer W on the wafer holding pins 1422 (this paragraph describes step S4 illustrated in FIG. 11).

In the present embodiment, the center of the delivery stage 1410 provided with the measurement function and the centers of the normal delivery stages 1420 are located on a common vertical straight line (Tc) (refer to FIG. 5). However, the center of the delivery stage 1410 provided with the measurement function and the centers of the normal delivery stages 1420 can be displaced as long as the amounts of the displacement are quantitatively recognized.

In the aforementioned procedure, the wafer pick 136 can place the wafer W on the wafer holding pins 1422 so that the center Tc of the normal delivery stage 1420 matches the center Wc of the wafer W. When the wafer W is appropriately placed on the wafer holding pins 1422 in this manner, the wafer pick 170 (illustrated in FIG. 9) of the substrate transfer device 17 can appropriately hold the wafer W and extract the wafer W from the normal delivery stage 1420.

After that, the wafer extracted by the substrate transfer device 17 from the delivery unit 14 is transferred into any of the processing units 16 by the substrate transfer device 17 as described above.

The wafer W transferred into the processing unit 16 is processed by the processing unit 16. After this process, the wafer W is carried by the substrate transfer device 17 out of the processing unit 16 and placed in one of the normal delivery stages 1420 installed in the upper delivery unit 14B of the delivery unit 14. Subsequently, the wafer W is extracted by the substrate transfer device 13 from the one normal delivery stage 1420 mounted in the upper delivery unit 14B and is returned to the carrier C of the carrier placing station 11.

The first procedure is applied to all wafers W extracted from the carriers C. Accordingly, the procedure provides an advantage that all the wafers W will be able to be accurately placed on a target position on the wafer pick 170 of the substrate transfer device 17.

In the first procedure, the guide pins 1423 of the normal delivery stages 1420 and the ride sensors 1426 may be omitted. Thus, the cost of the delivery unit 14, especially, the cost of the lower delivery unit 14A, can be reduced by the amount corresponding to the omission. However, the required time from the extraction of the wafers W from the carriers C till the placement of the wafers W in the normal delivery stages 1420 increases by the time required for the wafers W to pass through the delivery stage 1410 provided with the measurement function. Thus, if the throughput of the substrate processing system is placed an emphasis on, it is preferable that the aforementioned first procedure be applied under conditions that the time required for the processing unit 16 to process the wafers W is long or that a process of transferring the wafers W from the extraction of the wafers W from the carriers C to the placement of the wafers W in the normal delivery stages 1420 is not a rate-limiting factor.

<Second Procedure>

Although the aforementioned first procedure has an advantage of enabling all the wafers W to be accurately placed at the target position on the wafer pick 170 of the substrate transfer device 17 (the amounts of the displacement are substantially zero), the accuracy is not actually required in many cases. In general, as long as the amount of the displacement is approximately in a range of 1 mm to 2 mm, there will be no substantial problem with it. With the amount of the displacement being approximately in the range of 1 mm to 2 mm, the wafer W will be held on the holding nails 171 of the wafer pick 170 without a problem. In addition, if the wafer pick 170 or the substrate holders (mechanical chucks) of the processing units 16 has or have a self-alignment (self-centering) function, the displacement can be canceled out or reduced to a value that does not cause a problem with processes to be executed in the processing units 16. A second procedure will be described below on the basis of the premise of the aforementioned fact.

Figure 12:
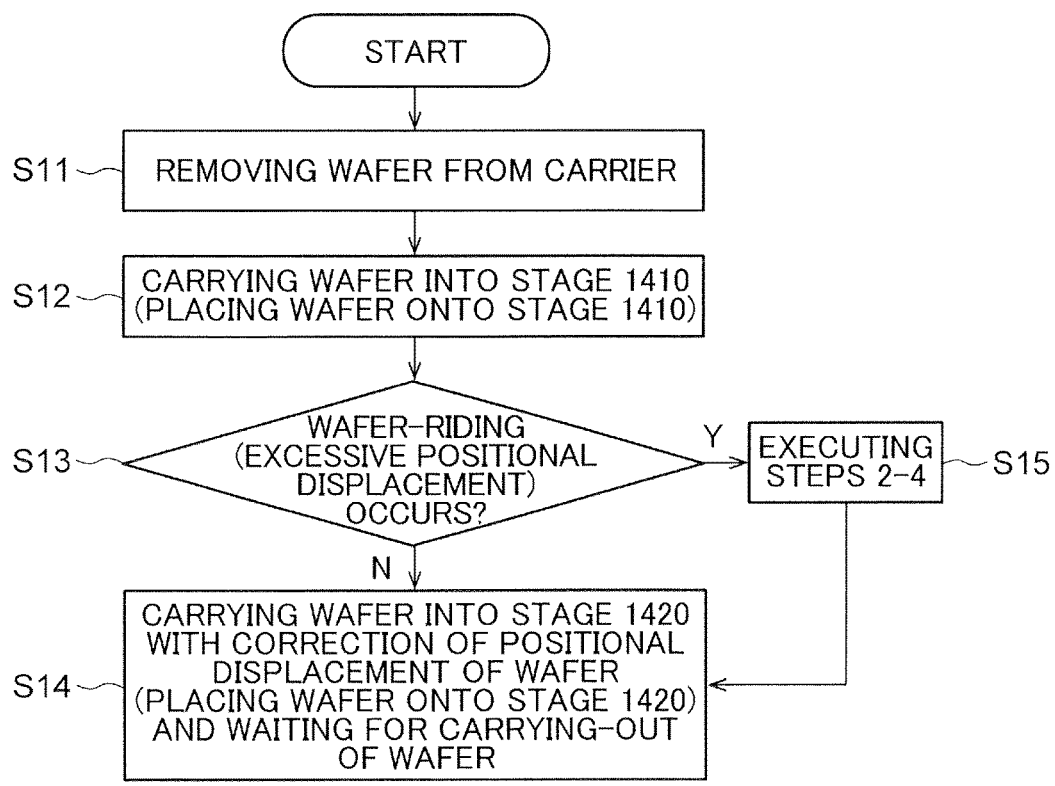
FIG. 12 is a flowchart of a second procedure of correcting positional displacement of a wafer.

In the second procedure, the wafer pick 136 of the horizontal articulated robot 130 extracts the wafer W from any of the carriers C (in step S11 illustrated in FIG. 12), transfers the wafer W directly into any of the normal delivery stages 1420 without passing through the delivery stage 1410 provided with the measurement function, and tries to place the wafer W on the wafer holding pins 1412 (in step 512 illustrated in FIG. 12).

At this time, if the positional displacement of the wafer W in a direction toward any one of the guide pins 1423 is smaller than the value of "CL+SL" (refer to FIG. 8), the wafer W is placed on the holding pins 1422 so that the center Wc of the wafer W is displaced by up to CL (for example, a range of approximately 2 mm to 3 mm) from the center Tc of the normal delivery stage 1420 in the radial direction of the wafer W. In this state, upper surfaces of all the three holding pins 1422 are in contact with the lower surface of the wafer W. Accordingly, the wafer W does not block the light path LP of the ride sensor 1426 at this time.

If the ride sensor 1426 does not detect that the wafer W has ridden onto any of the guide pins 1423 ("No" in step S13 illustrated in FIG. 12), the wafer W remains in the normal delivery stage 1420 (in step 514 illustrated in FIG. 12). The wafer W is then extracted by the wafer pick 170 of the substrate transfer device 17 from the normal delivery stage 1420 and transferred by the wafer pick 170 into any of the processing units 16.

If the amount of the displacement of the wafer W exceeds the value of "CL+SL", the wafer W rides on any of the upper end surfaces 1425 of the guide pins 1423 as indicated by a broken line illustrated in FIG. 8. Even if the guide pins 1423 are not provided and the wafer W displaced by the value of "CL+SL" is placed on the holding pins 1422, it is highly likely that the wafer W placed on the holding pins 1422 will not be held on the holding nails 171 of the wafer pick 170.

If the wafer W rides onto any of the guide pins 1423, the wafer W blocks the light path LP of the ride sensor 1426. The ride sensor 1426 consequently detects that the wafer W has ridden onto the guide pin 1423 (Yes in step S13 illustrated in FIG. 12).

Once the ride sensor 1426 detects that the wafer W has ridden onto the guide pin 1423, the wafer pick 136 holds the wafer W again and transfers the wafer W into the delivery stage 1410 provided with the measurement function. In the delivery stage 1410, the amount of positional displacement of the wafer W is detected in the same manner as in the first procedure. After the detection, the wafer pick 136 enters any of the normal delivery stages 1420 and places the wafer W on the wafer holding pins 1422 so as to cancel out the positional displacement of the wafer W in the same manner as in the first procedure. A procedure of transferring the wafer W after that is the same as the aforementioned first procedure (in step S15 illustrated in FIG. 15).

In the second procedure, the amount of positional displacement of only a wafer W displaced by a predetermined amount or greater is detected, the position of the wafer W is corrected, and a wafer W that is displaced by an amount smaller than the predetermined amount is not transferred into the delivery stage 1410 provided with the measurement function. Thus, the second procedure has an advantage over the first procedure in terms of the improvement of the throughput of the substrate processing system.

The first procedure may be executed on all the wafers W to be transferred. In addition, the second procedure may be executed on all the wafers W to be transferred. The second procedure, however, may be changed as follows.

In a case where the ride sensor 1426 continuously detects that a certain wafer W has ridden onto any of the guide pins 1423, it would be expected that the positions of all wafers W stored in a carrier C that houses the certain wafer W are significantly displaced due to vibration or the like during transfer, for example. In such a case, it is not preferable to execute a procedure of transferring a wafer W extracted from the carrier C into any of the normal delivery stages 1420. This is due to the fact that (1) it is a waste of time to transfer, into any of the normal delivery stages 1420, the wafer W that has a high probability of being transferred into the delivery stage 1410 provided with the measurement function and (2) it is not preferable to cause the wafer W in an inclined state to collide with any of the guide pins 1423 even if a device is not formed on the lower surface of the wafer W.

Thus, in cases where: a frequency at which the ride sensor 1426 detects that the wafer W has ridden onto any of the guide pins 1423 exceeds a predetermined frequency during the second procedure; the ride sensor 1426 detects that a predetermined number of wafers W have ridden onto any of the guide pins 1423; or a ratio of the number of wafers detected to ride onto any of the guide pins 1423 to a predetermined number of wafers exceeds a predetermined value, it would be preferable that the second procedure be switched to the first procedure.

After the second procedure is switched to the first procedure, the first procedure continues to be executed until all wafers W are extracted from a carrier C from which a wafer W is extracted at the time of the switching. The first procedure can be switched to the second procedure when a wafer W is extracted from another carrier C. Alternatively, the first procedure may be switched to the second procedure when the amounts of positional displacement of wafers W that are detected by the first procedure are stable and smaller than or equal to a predetermined value (that does not cause the wafers W to ride onto the guide pins 1423 in the normal delivery stages 1420).

The correction of the positional displacement of a wafer W during the transfer (forward path) of the wafer W extracted from a carrier C to a processing unit 16 has been described above. However, the positional displacement of the wafer W may be corrected during the transfer (backward path) of the wafer W processed by the processing unit 16 to the carrier C. It should be noted that the upper delivery unit 1413 (having the same configuration as the lower delivery unit 14A) for the backward path will be used for this correction.

In this case, the wafer pick 170 of the substrate transfer device 17 can execute a procedure based on the second procedure from the time when the wafer W is transferred into the normal delivery stage 1420. Specifically, if the wafer pick 170 tries to place the wafer W on the wafer holding pins 1412 of any of the normal delivery stages 1420 and the ride sensor 1426 does not detect that the wafer W has ridden onto any of the guide pins 1423, the wafer pick 136 of the substrate transfer device 13 will extract the wafer W from the normal delivery stage 1420 and transfer the wafer W into the carrier C.

Meanwhile, if the ride sensor 1426 detects that the wafer W has ridden onto any of the guide pins 1423, the wafer pick 136 of the substrate transfer device 13 will extract the wafer W from the normal delivery stage 1420 and transfer the wafer W into the delivery stage 1410 provided with the measurement function (and does not place the wafer on the holding pins 1411). The amount of positional displacement of the wafer W will then be quantitatively measured in the delivery stage 1410 while the wafer pick 136 will transfer the wafer W into the carrier C.

In the backward path, a procedure that is the same as or similar to the first procedure can be executed. Specifically, the wafer pick 170 of the substrate transfer device 17 transfers the wafer W into the delivery stage 1410 provided with the measurement function (while not placing the wafer W on the holding pins 1411), detects positional displacement of the wafer W, and places the wafer W on the holding pins 1422 of the normal delivery stage 1420 so as to cancel out the positional displacement. After that, the wafer pick 136 of the substrate transfer device 13 extracts the wafer W from the normal delivery stage 1420 and transfers the wafer W into the carrier C.

Figure 13:
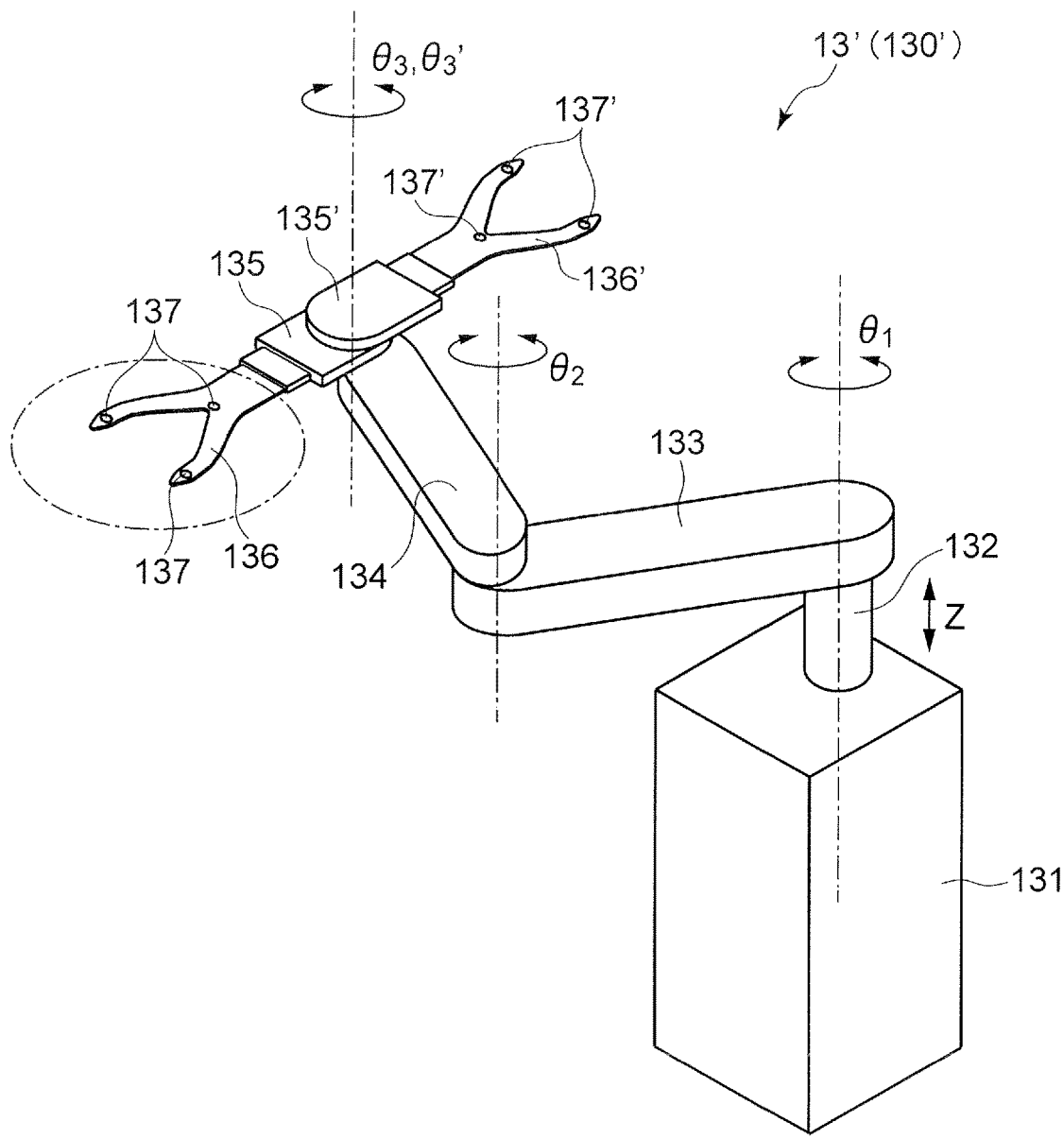
FIG. 13 is a perspective view describing a modified example of the first substrate transfer device having two wafer picks.

Instead of the substrate transfer device 13 (130), illustrated in FIG. 2, having the single wafer pick 136, a substrate transfer device 13' (130'), illustrated in FIG. 13, provided with a plurality of wafer picks, for example, two wafer picks 136 and 136', can be used. The two wafer picks 136 and 136' can rotate independently of each other around vertical pivot axes (θ3, θ3') extending on the same straight line. Specifically, for example, when the wafer pick 136 tries to place or extract the wafer W at or from a position in which the wafer W is to be placed, the other wafer pick 136' can be retracted while being oriented toward the opposite side to the wafer pick 136, as illustrated in FIG. 13. In addition, if two wafers marked with "W" are to be extracted from a carrier C simultaneously, the two wafer picks 136 and 136' can be positioned so as to overlap each other when viewed from above. The substrate transfer device 13' illustrated in FIG. 13 has the same configuration as the substrate transfer device 13 illustrated in FIG. 2 except for the aforementioned configuration. A duplicate description thereof is hence omitted.

The first procedure to be executed with the substrate transfer device 130' illustrated in FIG. 13 will be described below.

First, the wafer picks 136 and 136' extract two wafers W from a carrier C simultaneously.

One of the wafer picks (for example, the wafer pick 136) enters the delivery stage 1410 provided with the measurement function, and positional displacement of the wafer W held by the wafer pick 136 is measured. During the series of operations, the other wafer pick 136' is oriented toward the opposite side to the wafer pick 136 and retracted (refer to FIG. 13).

Second, the wafer pick 136 exits from the delivery stage 1410 provided with the measurement function. Then, the wafer pick 136' enters the delivery stage 1410 provided with the measurement function before positional displacement of the wafer W held by the wafer pick 136' is measured. During the series of operations, the wafer pick 136 is oriented toward the opposite side to the wafer pick 136' and retracted.

Third, the wafer pick 136 places the wafer W on the wafer holding pins 1422 of one of the normal delivery stages 1420 on the basis of a result of the measurement while canceling out the positional displacement of the held wafer W.

At this time, the wafer pick 136' is oriented toward the opposite side to the wafer pick 136 and retracted (refer to FIG. 13).

Fourth, the wafer pick 136' places the wafer W on the wafer holding pins 1422 of another normal delivery stage 1420 adjacent to the aforementioned normal delivery stage 1420 on the basis of a result of the measurement while canceling out the positional displacement of the held wafer W. At this time, the wafer pick 136 is oriented toward the opposite side to the wafer pick 136' and retracted (refer to FIG. 13).

After these steps, the wafer pick 170 of the substrate transfer device 17 sequentially extracts the wafers W from the normal delivery stages 1420.

The second procedure with the use of the substrate transfer device 130' illustrated in FIG. 13 will now be described below.

First, the wafer picks 136 and 136' extract two wafers W from a carrier C simultaneously.

Second, the wafer picks 136 and 136' try to place the two wafers W on holding pins 1422 of normal delivery stages 1420 adjacent to each other.

If the ride sensors 1426 detect that the two wafers W have been placed on the holding pins 1422 without riding onto any of the guide pins 1423, the two wafers W are sequentially extracted by the wafer pick 170 of the substrate transfer device 17 after the detection.

If the ride sensors 1426 detect that the two wafers W both have ridden onto any of the guide pins 1423, the wafer picks 136 and 136' extract the wafers W placed in the normal delivery stages 1420 adjacent to each other. The first procedure is then executed after the extraction.

If one of the wafers W is placed on holding pins 1422 without riding onto any of the guide pins 1423 and the ride sensor 1426 detects that the other wafer W has ridden onto any of the guide pins 1423, one (preferably a wafer pick [for example, the wafer pick 136] that has transferred the other wafer W into a normal delivery stage 1420) of the wafer picks 136 and 136' extracts the wafer W riding onto the guide pin 1423 from the concerned normal delivery stage 1420. At this time, the wafer pick 136' is oriented toward the opposite side to the wafer pick 136 and retracted (refer to FIG. 13). The wafer W that has not ridden onto any of the guide pins 1423 remains in the normal delivery stage 1420 and waits to be extracted by the wafer pick 170 of the substrate transfer device 17.

Third, the wafer pick 136 enters the delivery stage 1410 provided with the measurement function while holding the wafer W extracted from the normal delivery stage 1420. The positional displacement of the wafer W held by the wafer pick 136 is then measured. During the series of operations, the other wafer pick 136' is oriented toward the opposite side to the wafer pick 136 and retracted (refer to FIG. 13).

Fourth, the wafer pick 136 places the wafer W on the wafer holding pins 1422 of the normal delivery stage 1420, into which the wafer has been transferred, on the basis of a result of the aforementioned measurement so as to cancel out the positional displacement of the held wafer W. At this time, the wafer pick 136' is oriented toward the opposite side to the wafer pick 136 and retracted (refer to FIG. 13). After this step, the wafer W remains in the normal delivery stage 1420 and waits to be extracted by the wafer pick 170 of the substrate transfer device 17.

According to the aforementioned embodiment, even if a device capable of quantitatively measuring positional displacement of the wafer W cannot be installed in the first substrate transfer device 13, the positional displacement of the wafer W still can be accurately recognized and reliably corrected on the basis of data of the positional displacement by use of the delivery stage 1410 provided with the measurement function and arranged independently of the first substrate transfer device 13.

In the aforementioned embodiment, the edge position detecting devices 1413 that are arranged in the delivery stage 1410 provided with the measurement function detect positional displacement of the wafer W while the wafer W is not placed on wafer holding members (for example, the holding pins 1412). It is, therefore, possible to prevent a wasteful transfer time caused by the placement of the wafer W on the wafer holding members, the lower surface of the wafer W from being damaged due to collision of the wafer W with the wafer holding members, or particles from being generated due to the collision.

In the aforementioned embodiment, the guide pins 1423 and the ride sensors 1426 are arranged in the normal delivery stages 1420. Detecting the excessive positional displacement qualitatively determines whether actual positional displacement of the wafer W from the target position of the wafer W on the holding pins 1422 is in the allowable range (only the determination on whether the actual positional displacement is in the allowable range is made without the quantitative measurement) (in the second procedure). Since whether the wafer W is required to be transferred into the delivery stage 1410 provided with the measurement function is determined on the basis of the excessive positional displacement detection (screening by the rough determination) or whether the excessive positional displacement detection is required to be omitted is made, it is possible to prevent a waste of time in executing unnecessary transfer and unnecessarily measure positional displacement.

Figure 14:
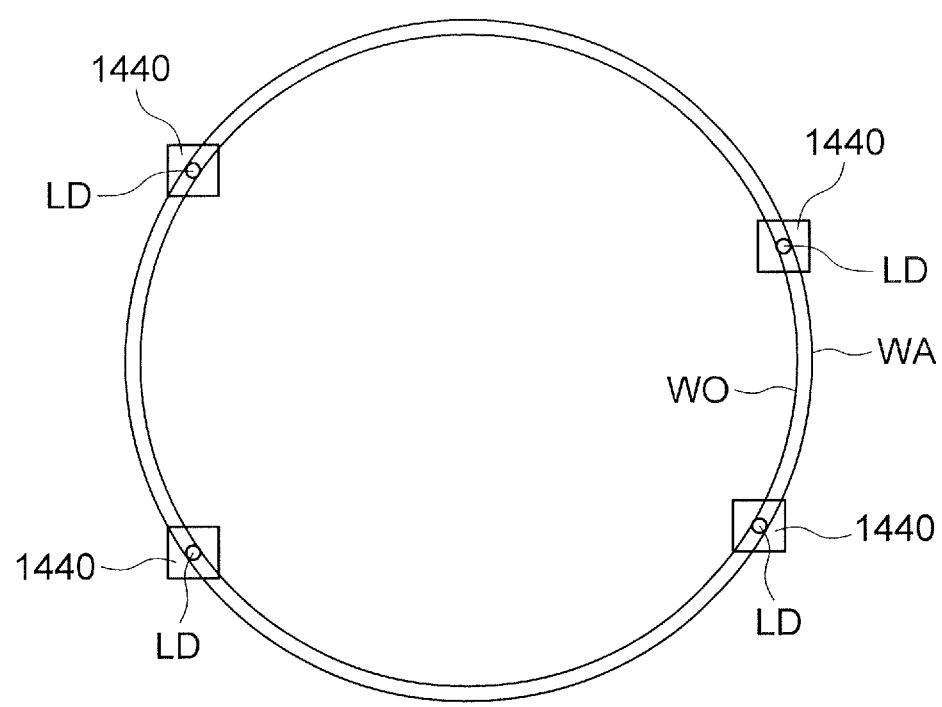
FIG. 14 is a schematic plan view describing an exemplary configuration of an excessive positional displacement detecting device that can be installed in the normal delivery stage.

It should be noted in the aforementioned embodiment, a vertical position of the wafer W changes if the wafer W rides onto any of the guide pins 1423 in any of the normal delivery stages 1420, and whether the positional displacement of the wafer W is in the allowable range is detected by detecting the change in the vertical position. The embodiment, however, is not limited to this. If sufficient spaces are secured between the normal delivery stages 1420, edge position detecting devices 1413 that are the same as the edge position detecting devices 1413 arranged in the delivery stage 1410 provided with the measurement function may be arranged in the normal delivery stages 1420. Alternatively, as schematically illustrated in FIG. 14, detectors 1440 that are each composed of a light emitter and a light receiver may be arranged at multiple (for example, four) positions around the circumference of the wafer W, and whether the positional displacement of the wafer is in the allowable range may be determined on the basis of whether light has been received by the light receivers. In this case, the detectors are arranged so that if the positional displacement of the wafer W is in the allowable range (indicated by a circle WA), the wafer W does not completely block light paths LD extending from the light emitters of all the detectors to the light receivers of all the detectors in the vertical direction, and that if the positional displacement of the wafer W is not in the allowable range, the wafer W completely blocks the light paths LD. If it is confirmed that one of the detectors does not receive light, the positional displacement of the wafer W is detected not to be in the allowable range or is detected to be excessive. The circle WA illustrated in FIG. 14 indicates an outline of the wafer W placed at the target position.

In the aforementioned embodiment, the delivery stage 1410 provided with the measurement function and the normal delivery stages 1420 are unified and form a single unit. The embodiment, however, is not limited to this. Although the delivery stage 1410 provided with the measurement function should preferably be arranged close to the normal delivery stages 1420, the delivery stage 1410 provided with the measurement function may be arranged at any position so as to ensure that the substrate transfer device 13 can access the delivery stage 1410 provided with the measurement function.

What is claimed is:

1. A substrate processing apparatus comprising:
   a first place and a second place, each configured to allow a circular substrate to be placed thereon;
   a substrate transfer device having a substrate holder for holding the substrate, and configured to transfer the substrate at least between the first place and the second place; and
   a substrate position measuring unit configured to detect a position of the substrate held by the substrate holder;
   wherein the substrate position measuring unit is disposed at a position independently from the substrate transfer device, where the substrate held by the substrate holder of the substrate transfer device can be brought into the substrate position measuring unit,
   wherein the substrate position measuring unit has a plurality of edge position measuring devices arranged along a circumferential direction, wherein positions of the edge of the substrate having been brought into the substrate position measuring unit is detected by the edge position measuring devices with the substrate held by the substrate transfer device, and wherein a positional displacement of an actual position of the substrate held by the substrate holder with respect to the substrate holder can be calculated,
   wherein the second place has a plurality of stages, which are stacked in a vertical direction, and which are each configured to allow the substrate to be placed thereon, and wherein centers of the stages and a center of a circumference along which the edge position measuring devices are arranged on a single vertical line, and
   wherein an excessive positional displacement detector is disposed on each of the stages in the second place that detects whether or not a displacement of a center of the substrate with respect to the center of the stage exists when the substrate is on the stage.

2. The substrate processing apparatus according to claim 1, wherein the substrate transfer device is an articulated robot.

3. The substrate processing apparatus according to claim 1, wherein the second place has another stage, the another stage having a center arranged on the single vertical line, and wherein the substrate position measuring unit is disposed in the another stage.

4. The substrate processing apparatus according to claim 1, further comprising a controller capable of executing, if an unallowable positional displacement is detected at a frequency higher than a predetermined frequency, a positional displacement correcting procedure.

5. The substrate processing apparatus according to claim 1, wherein each of the plurality of first stages is provided with guide pins that guide the substrate to a target position at which the substrate is to be placed on the corresponding stage, and also is provided with a ride sensor that detects that the substrate rides on an upper end surface of any one of the guide pins.

6. The substrate processing apparatus according to claim 4,
   wherein the controller is further capable of executing the positional displacement correcting procedure only when the positional displacement detected by the excessive positional displacement detector is not in an allowable range.

7. The substrate processing apparatus according to claim 6, wherein, if an unallowable positional displacement is detected by the positional displacement detection procedure at a frequency higher than the predetermined frequency, the controller is further capable of executing the positional displacement correcting procedure without executing the positional displacement detection procedure for a predetermined time period.

8. A method for correcting positional displacement of a substrate in a substrate processing apparatus,
   the substrate processing apparatus including:

a first place and a second place, each configured to allow a circular substrate to be placed thereon;

a substrate transfer device having a substrate holder for holding the substrate, and configured to transfer the substrate at least between the first place and the second place, and a substrate position measuring unit configured to detect a position of the substrate held by the substrate holder, wherein the substrate position measuring unit is disposed at a position independently from the substrate transfer device, where the substrate held by the substrate holder of the substrate transfer device can be brought into the substrate position measuring unit, wherein the substrate position measuring unit has a plurality of edge position measuring devices arranged along a circumferential direction, wherein positions of the edge of the substrate having been brought into the substrate position measuring unit is detected by the edge position measuring devices with the substrate held by the substrate transfer device, and wherein a positional displacement of an actual position of the substrate held by the substrate holder with respect to the substrate holder can be calculated, wherein the second place has a plurality of stages, which are stacked in a vertical direction, and which are each configured to allow the substrate to be placed thereon, and wherein centers of the stages and a center of a circumference along which the edge position measuring devices are arranged on a single vertical line, wherein an excessive positional displacement detector is disposed on each of the stages in the second place that detects whether or not a displacement of a center of the substrate with respect to the center of the stage exists when the substrate is on the stage, said method comprising:

causing the substrate transfer device to transfer the substrate from the first place into the substrate position measuring unit;

causing the substrate position measuring unit to detect the position of the center of the substrate, which is being held by the substrate holder, calculating, based on the detected position of the center of the circular substrate, a positional displacement of an actual position of the substrate held by the substrate holder with respect to the substrate holder from a target position of the substrate to be held by the substrate holder with respect to the substrate holder; and causing the substrate transfer device to place, based on the calculated positional displacement, the substrate on any one of the stages so as to cancel out the positional displacement.

9. The method according to claim 8, further comprising:
placing the substrate in the second place,
wherein the excessive positional displacement detector detects whether actual positional displacement of the substrate with respect to the second place is in an allowable range when the substrate is placed in the second place, wherein calculating the positional displacement detection includes causing the excessive positional displacement detector to detect whether the positional displacement of the substrate is in an allowable range before the positional displacement correction, and wherein the positional displacement correction is executed only if the positional displacement detected by the excessive positional displacement detector is not in the allowable range.

10. The method according to claim 9, wherein, if an unallowable positional displacement is detected by the excessive positional displacement detector at a frequency higher than a predetermined frequency, the positional displacement correction is thereafter executed without executing the excessive positional displacement detection for a predetermined time period.

11. A non-transitory storage medium storing a program that is executed by a computer serving as a control device configured to control an operation of a substrate processing apparatus and causes the computer to control the substrate processing apparatus so as to ensure that the substrate processing apparatus executes the method according to claim 8.

12. The substrate processing apparatus according to claim 1, wherein the substrate transfer device is referred to a first substrate transfer device, said substrate processing apparatus further comprising:
a substrate processing unit; and
a second substrate transfer device that transfers the substrate from the second place to the substrate processing unit, after the position of the substrate has been detected with the substrate being held by the substrate holder of the substrate transfer device, wherein the first place is a carrier placing section on which a carrier containing a plurality of substrate is placed, and wherein the second place is a place at which the substrate having been transferred from the first place to the second place by the first substrate transfer device is transferred to the second substrate transfer device.

13. The substrate processing apparatus according to claim 1, wherein:
each of the stages and the substrate position measuring unit has a bottom plate;
each of adjacent two bottom plates of the stages are coupled by columns while leaving a first vertical gap therebetween; and
adjacent bottom plates of the stages and the substrate position measuring unit are coupled by columns while leaving a second vertical gap therebetween, the first vertical gap being larger than the second vertical gap.

* * * * *